US011537571B2

(12) United States Patent
Mathur

(10) Patent No.: US 11,537,571 B2
(45) Date of Patent: Dec. 27, 2022

(54) COLUMN DATA COMPRESSION SCHEMES FOR SCALING WRITES AND READS ON DATABASE SYSTEMS

(71) Applicant: salesforce.com, inc., San Francisco, CA (US)

(72) Inventor: Rohitashva Mathur, Walnut Creek, CA (US)

(73) Assignee: Salesforce, Inc., San Francisco, CA (US)

( * ) Notice: Subject to any disclaimer, the term of this patent is extended or adjusted under 35 U.S.C. 154(b) by 218 days.

(21) Appl. No.: 16/141,572

(22) Filed: Sep. 25, 2018

(65) Prior Publication Data

US 2020/0097571 A1 Mar. 26, 2020

(51) Int. Cl.
| | |
|---|---|
| *G06F 16/215* | (2019.01) |
| *G06F 16/22* | (2019.01) |
| *G06F 16/23* | (2019.01) |
| *G06F 16/2455* | (2019.01) |
| *H03M 7/46* | (2006.01) |
| *H03M 7/30* | (2006.01) |

(52) U.S. Cl.
CPC ......... *G06F 16/215* (2019.01); *G06F 16/221* (2019.01); *G06F 16/2282* (2019.01); *G06F 16/2365* (2019.01); *G06F 16/2456* (2019.01); *H03M 7/3088* (2013.01); *H03M 7/46* (2013.01)

(58) Field of Classification Search
CPC .. G06F 16/215; G06F 16/221; G06F 16/2282; G06F 16/2456; G06F 16/2365; H03M 7/3088; H03M 7/46
See application file for complete search history.

(56) References Cited

U.S. PATENT DOCUMENTS

| | | | | |
|---|---|---|---|---|
| 8,838,539 B1 * | 9/2014 | Ashcraft | ............. | H04L 49/9005 707/637 |
| 9,305,045 B1 * | 4/2016 | Cohen | ................. | H03M 7/6094 |
| 2007/0143274 A1 * | 6/2007 | Uppala | ............... | G06F 16/2471 |
| 2011/0029569 A1 * | 2/2011 | Ganesh | ................. | G06F 16/284 707/796 |
| 2013/0060780 A1 * | 3/2013 | Lahiri | .................... | H03M 7/42 707/741 |
| 2013/0173798 A1 * | 7/2013 | Micucci | .............. | H04L 67/1044 709/225 |
| 2016/0094242 A1 * | 3/2016 | Ackerman | .............. | H03M 7/46 341/51 |
| 2019/0095244 A1 * | 3/2019 | Eda | ......................... | G06F 9/462 |

* cited by examiner

*Primary Examiner* — Belix M Ortiz Ditren
*Assistant Examiner* — Dustin D Eyers
(74) *Attorney, Agent, or Firm* — Wong & Rees LLP; Zhichong Gu

(57) ABSTRACT

A request for performing a data storing operation directed to a database table that comprises a plurality of table columns is received. Columnar compression metadata is accessed to identify one or more table columns in the database table, each of the one or more table columns being designated to store compressed columnar values. The columnar compression metadata is used to apply one or more columnar compression methods to generate, from one or more uncompressed columnar values received with the request for the data storing operation, one or more compressed columnar values to be persisted in the one or more table columns in the database table. A database statement is executed to persist the one or more compressed columnar values in the one or more table columns in the database table.

24 Claims, 12 Drawing Sheets

Database Table 202

| c1: d1 | c2: d2 | c3: d3 | ... | cn: dn |
|---|---|---|---|---|

FIG. 2A

Columnar Compression Metadata 204

| Col. Id | Comp. Method | Comp. Op Metadata |
|---|---|---|
| c1 | cm1 | cod1 |
| c2 | cm2 | cod2 |
| c3 | cm3 | cod3 |
| ... | | |
| cn | cmn | codn |

FIG. 2B

Columnar Compression Operational Metadata
206-2

| Uncompressed Col. Values | Compressed Col. Values | PK |
|---|---|---|
| city1 | 1 | pk1 |
| city2 | 2 | pk2 |
| city3 | 3 | pk3 |
| ... | | |

FIG. 2D

Columnar Compression Operational Metadata
206-1

| Uncompressed Col. Values | Compressed Col. Values |
|---|---|
| city1 | 1 |
| city2 | 2 |
| city3 | 3 |
| ... | |

FIG. 2C

COLUMN DATA COMPRESSION SCHEMES FOR SCALING WRITES AND READS ON DATABASE SYSTEMS

TECHNICAL FIELD

The present invention relates generally to database systems, and in particular, to column data compression schemes for scaling writes and reads on database systems.

BACKGROUND

A large-scale cloud-based multitenant computing system may include multiple datacenters at various geographic locations to maintain millions of sets of application data for millions of organizations as well as provide millions of sets of application services such as those for customer relationship management (CRM), secured data access, online transaction processing, mobile apps, etc., to respective users and/or customers of these organizations.

Databases such as Oracle, Sayonara/Postgres, and so forth, used in the multitenant computing system may be row oriented. Compression schemes adopted by these databases operate at a row level and result in row-based compressions, which are suboptimal as compared with column-based compressions. Apart from being less efficient than the column-based compressions, the row-based compressions in these databases also consume significant system resources allocated to database servers and seriously affect system and database scalabilities in the multitenant computing system.

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section. Similarly, issues identified with respect to one or more approaches should not assume to have been recognized in any prior art on the basis of this section, unless otherwise indicated.

BRIEF DESCRIPTION OF DRAWINGS

The present invention is illustrated by way of example, and not by way of limitation, in the figures of the accompanying drawings and in which like reference numerals refer to similar elements and in which:

FIG. 2A illustrates an example database table; FIG. 2B illustrates example columnar compression metadata; FIG. 2C and FIG. 2D illustrate example columnar compression operational metadata;

DESCRIPTION OF EXAMPLE EMBODIMENTS

Figure 1A:
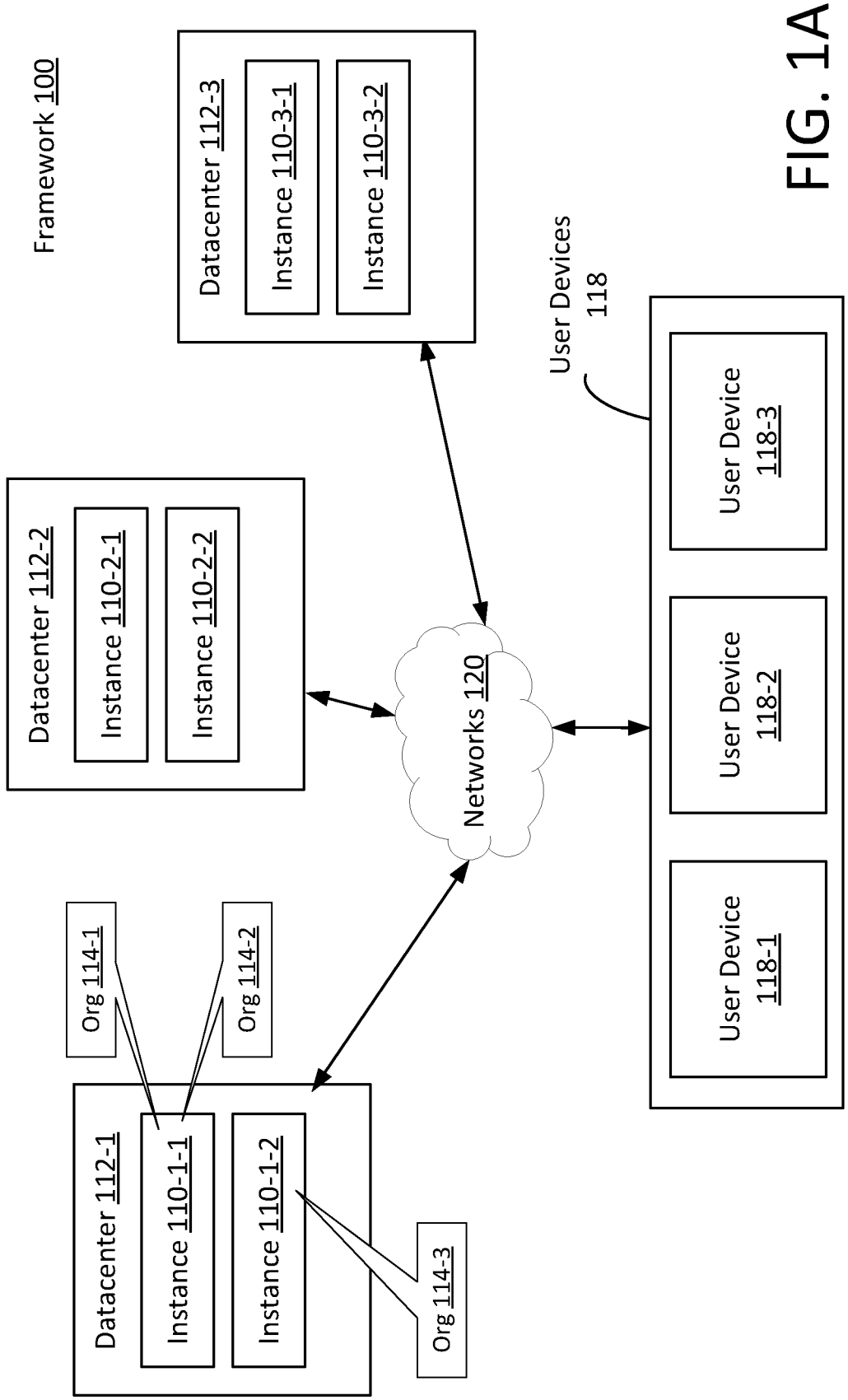
FIG. 1A illustrates an example overall columnar compression and decompression framework.

In the following description, for the purposes of explanation, numerous specific details are set forth in order to provide a thorough understanding of the present invention. It will be apparent, however, that the present invention may be practiced without these specific details. In other instances, well-known structures and devices are not described in exhaustive detail, in order to avoid unnecessarily occluding, obscuring, or obfuscating the present invention.

Example embodiments are described herein according to the following outline:

1.0. General Overview
2.0. Functional Overview
2.1 Inspecting and Performing Database Operations
2.2 Writing and Reading Columnar Compressed Data
2.3 Data Storing Operations
2.4 Data Retrieval Operations
2.5 Example Implementations
3.0. Example Embodiments
4.0 Implementation Mechanism—Hardware Overview
5.0. Extensions and Alternatives

1.0 GENERAL OVERVIEW

This overview presents a basic description of some aspects of an embodiment of the present invention. It should be noted that this overview is not an extensive or exhaustive summary of aspects of the embodiment. Moreover, it should be noted that this overview is not intended to be understood as identifying any particularly significant aspects or elements of the embodiment, nor as delineating any scope of the embodiment in particular, nor the invention in general. This overview merely presents some concepts that relate to the example embodiment in a condensed and simplified format, and should be understood as merely a conceptual prelude to a more detailed description of example embodiments that follows below.

Computing services and applications are increasingly being pushed to (e.g., public, private, etc.) computing clouds. Instead of storing data locally or on premises in proprietary computing systems, large amounts of data including but not limited to system data, application data, service data, analysis data, proprietary data, secure transaction data, decision support data, journaling data, artificial intelligence (AI) related data, machine learning (ML) related data, etc., are now stored with cloud-based database systems.

Techniques as described herein can be used to significantly improve scalability of database systems and/or related systems operating in conjunction with the database systems. The techniques can be used to provide a data storing and retrieval mechanism/framework to use highly efficient column level or column-based compressions to transparently compress data/information to be persisted with databases in data storing operations and decompress data/information persisted with the databases in data retrieval operations. Instead of grouping and compressing data/information of a mixture of different data types for each row (or for each data block storing multiple rows, etc.) in row-based compressions, data/information of the same data type corresponding to each column of a database table is grouped and compressed in the column-based compressions (or columnar compressions).

Column-based compression (and corresponding decompression) can be implemented through any combination of a variety of application servers, database servers, front processes, platform processes, proxy agents, proxy servers, etc.

By way of example but not limitation, some or all of column-based compression and decompression as described herein may be implemented with one or more application servers operating in conjunction with database servers. This reduces the workload on the database servers, as most (if not all) of the column-based compression (and/or decompression) can be performed on the application servers. The database servers operating in conjunction with the application server can expend considerably less (e.g., computing, data server, database I/O, storage area network or SAN I/O, network I/O, etc.) resources to write/save/persist/retrieve the data/information with the databases.

Furthermore, the size of data/information to be persisted in the databases, as received by the database servers, is also much reduced after the application servers have compressed the data/information. The reduction of data/information to be persisted can be particularly significant when column-based compression (or columnar compression) schemes as described herein are used to compress the data/information.

As the compressed columnar values have much smaller data sizes than uncompressed columnar values, storage space in the databases can be saved by storing the compressed columnar values rather than the uncompressed columnar values. The saving of the storage space under techniques as described herein can be especially significant in operational scenarios in which the uncompressed columnar values—in the form of sequences/arrays each of which sequences/arrays is a sequence/array of columnar data values of the same data type—comprises a high degree of redundancies (e.g., consecutive columnar data values in a sequence/array of columnar data values may sometimes have relatively little differences, etc.) and has a high degree of data type uniformity (e.g., each sequence/array of columnar data values to be compressed in the columnar compression schemes is of the same data type, etc.).

In data retrieval operations, given relatively small data sizes of the persisted compressed columnar values, the database servers can spend less I/O resources and/or less computing resources to retrieve the persisted compressed columnar values. The persisted compressed columnar values can be handed off to the application servers for performing columnar decompression operations.

As used herein, columnar data refers to data in a table column of a database table that may be persisted with one or more databases. In columnar compression schemes, columnar data of a table column, which is of the same data type, may be compressed together (e.g., as one or more compression data units, etc.). The table column of the database table may be one among a plurality of (e.g., built-in, user-defined, system-defined, etc.) data types such as numbers, strings, texts, dates, bytes, blobs, supported by the one or more databases. In the columnar compression schemes, columnar data of each of these different table columns may be compressed together (e.g., as one or more compression data units, etc.) and separately from other columnar data of the others of these different table columns.

Columnar compression techniques as described herein can make use of the fact that, by definition, columnar data is of the same type (or single attribute), and therefore allows for significantly more compression than row-based data which may comprise data of multiple columns of different types (or different attributes). Given that the columnar data is of the same type, there likely exists more data redundancy—which can be readily exploited by any combination of a wide variety of data compression schemes/methods/algorithms/procedures—in the columnar data than the row-level data.

Under techniques as described herein, each columnar data type (e.g., in the form of a sequence/array of data values of the same data type, etc.) among different columnar data types corresponding to different table columns or different data types of table columns in the database table may be compressed with a respective compression scheme, method, algorithm, procedure, etc., among different schemes, methods, algorithms, procedures, etc. For example, a specific (e.g., optimal, optimized, etc.) compression scheme, method, algorithm, procedure, etc., may be adopted for compressing data/information for city names (e.g., columnar data of a "CityName" table column, etc.) in the database table, while different (e.g., optimal, optimized, etc.) schemes, methods, algorithms, procedures, etc., may be adopted for respectively compressing data/information for columnar data of arbitrary text, dates, numbers, etc., in the database table. As a result, the compression techniques can be highly efficient, as compared with other compression techniques (e.g., row-level compression, multi-attribute compression, etc.) that do not implement the techniques as described herein.

Requests for performing data storing operations or data retrieval operations, as originated from user applications, platform applications, etc., may be intercepted by an application server operating in conjunction with a database server.

In operational scenarios in which a request for performing data storing operations in connection with a database table is received, the application server can identify table columns of the database table that are designated for columnar compression, for example based on columnar compression metadata. The application server can further inspect and validate incoming uncompressed columnar values and apply specified columnar compression methods/schemes, for example as identified in the columnar compression metadata, to generate compressed columnar values from the received uncompressed columnar values. The application server can set up a correct database statement with the compressed columnar values (and/or any other uncompressed columnar values for table columns not designated for columnar compression) and execute the database statement by way of the database server, thereby causing the compressed columnar values (and/or any other uncompressed columnar values for table columns not designated for columnar compression) to be persisted in the database table.

In operational scenarios in which a request for performing data retrieval operations in connection with a database table is received, the application server can identify table columns of the database table that are designated for columnar compression, for example based on the columnar compression metadata. The application server can set up a correct database statement (e.g., based at least in part on the columnar compression metadata, etc.) and execute the database statement by way of the database server, thereby causing compressed columnar values (and/or any other uncompressed columnar values for table columns not designated for columnar compression) to be retrieved from the database table. The application server can further inspect and convert (e.g., based at least in part on the columnar compression metadata, etc.) the retrieved column values from the database table to uncompressed columnar values and return the uncompressed columnar values to a request entity that initiates or originates the request for performing data retrieval operations. Additionally, optionally or alternatively, the application server can simply pass the compressed columnar values (and/or any other uncompressed columnar values for table columns not designated for columnar compression) as retrieved from the database table directly to the request entity for further processing including but not limited to performing columnar decompression on the retrieved columnar values from the database table.

Columnar compression metadata may be defined to guide how columnar compression operations in data storing operations and/or columnar decompression operations in data retrieval operations should be performed. The columnar compression metadata may include a dictionary to map uncompressed columnar value to compressed columnar values for a table column.

In some operational scenarios, compressed columnar values and/or decompressed columnar values can be stored or returned without complying with a specific (e.g., pre-defined, index-based, value-based, dictionary-based, etc.) order.

In some operational scenarios, compressed columnar values and/or decompressed columnar values can be stored or returned with a specific (e.g., pre-defined, index-based, value-based, dictionary-based, etc.) order.

In an example, an ordered dictionary may be specified as a part of columnar compression metadata. The ordered dictionary may order uncompressed columnar values such as "city1", "city2", etc., in a specific order. Columnar compression operations as described herein may substitute uncompressed columnar values with compressed columnar values and storing the compressed columnar values in the database table, while observing the specific order as specified in the ordered dictionary.

In another example, an index may be defined, for example based on a primary key column, for uncompressed columnar value. The index may order uncompressed columnar values such as "city1", "city2", etc., in a specific order. Columnar compression operations as described herein may sort uncompressed columnar values based on the specific order of the index, substitute uncompressed columnar values with compressed columnar values, and storing the compressed columnar values in the database table, while observing the specific order as specified in the index.

Various modifications to the preferred embodiments and the generic principles and features described herein will be readily apparent to those skilled in the art. Thus, the disclosure is not intended to be limited to the embodiments shown, but is to be accorded the widest scope consistent with the principles and features described herein.

2.0 FUNCTIONAL OVERVIEW

FIG. 1A illustrates an example overall columnar compression and decompression framework 100 in a computing system. Example computing systems that implement the columnar compression and decompression framework (100) may include, but are not necessarily limited to: any of: a large-scale cloud-based computing system, a system with multiple datacenters, multitenant data service systems, web-based systems, systems that support massive volumes of concurrent and/or sequential transactions and interactions, database systems, data analysis systems, premise-based computing system, secure transaction systems, decision support systems, data warehouses, data journaling systems, AI related systems, ML related systems, and so forth. Various system constituents may be implemented through software, hardware, or a combination of software and hardware. Any, some or all of these system constituents may be interconnected and communicated directly or indirectly, for example through one or more networks 120.

In some embodiments, the computing system that hosts the organizations may comprise a plurality of datacenters such as 112-1, 112-2, 112-3, etc., which may be located at the same or different geographic locations such as the same or different continents, the same or different countries, the same or different states, the same or different regions, and so forth.

Each data center may implement a set of system instances to host respective organizations. These organizations may contract with the owner of the computing system such as a multi-tenant computing system to host their respective (e.g., organization-specific, organization-common, etc.) application data, to provide their (e.g., organization-specific, organization-common, etc.) application services to their respective users and/or customers. Examples of application data may include, but not necessarily limited to only, organization-specific application data, organization-common application data, application configuration data, application data, application metadata, application code, etc., specifically generated or configured for (e.g., organization-specific, organization-common, etc.) application services of an individual organization.

As used herein, the term "organization" may refer to some or all of (e.g., complete, original, a non-backup version of, a non-cached version of, an online version of, original plus one or more backup or cached copies, an online version plus one or more offline versions of, etc.) application data of an organization hosted in the computer system and application services of the organization based at least in part on the application data.

As illustrated in FIG. 1A, each datacenter (e.g., 112-1, 112-2, 112-3, etc.) may comprise a set of one or more system instances. A first datacenter 112-1 comprises first system instances 110-1-1, 110-1-2, etc.; a second datacenter 112-2 comprises second system instances 110-2-1, 110-2-2, etc.; a third datacenter 112-3 comprises third system instances 110-3-1, 110-3-2, etc.

Each system instance (e.g., 110-1-1, 110-1-2, 110-2-1, 110-2-2, 110-3-1, 110-3-2, etc.) in the hosting computing system can host up to a maximum number of organizations such as 5,000 organizations, 10,000 organizations, 15,000+ organizations, etc. As illustrated in FIG. 1A, the system instance (110-1-1) in the datacenter (112-1) may host a first organization 114-1 and a second organization 114-2, among others; the system instance (110-1-1) in the datacenter (112-1) may host a third organization 114-3, among others.

The multitenant computing system may comprise application servers and database servers in system instances for processing database operations. These database operations may be invoked or initiated from user operations and/or user applications at user devices 118. Requests for performing these database operations may be received by the application servers operating in conjunction with the database servers. To perform these requested database operations, the application server can interact with the database servers to store columnar compressed data and retrieve columnar compressed data—as maintained in databases accessible to the system instances—for one or more organizations in the plurality of organizations hosted in the multitenant computing system.

2.1 Inspecting and Performing Database Operations

Figure 1B:
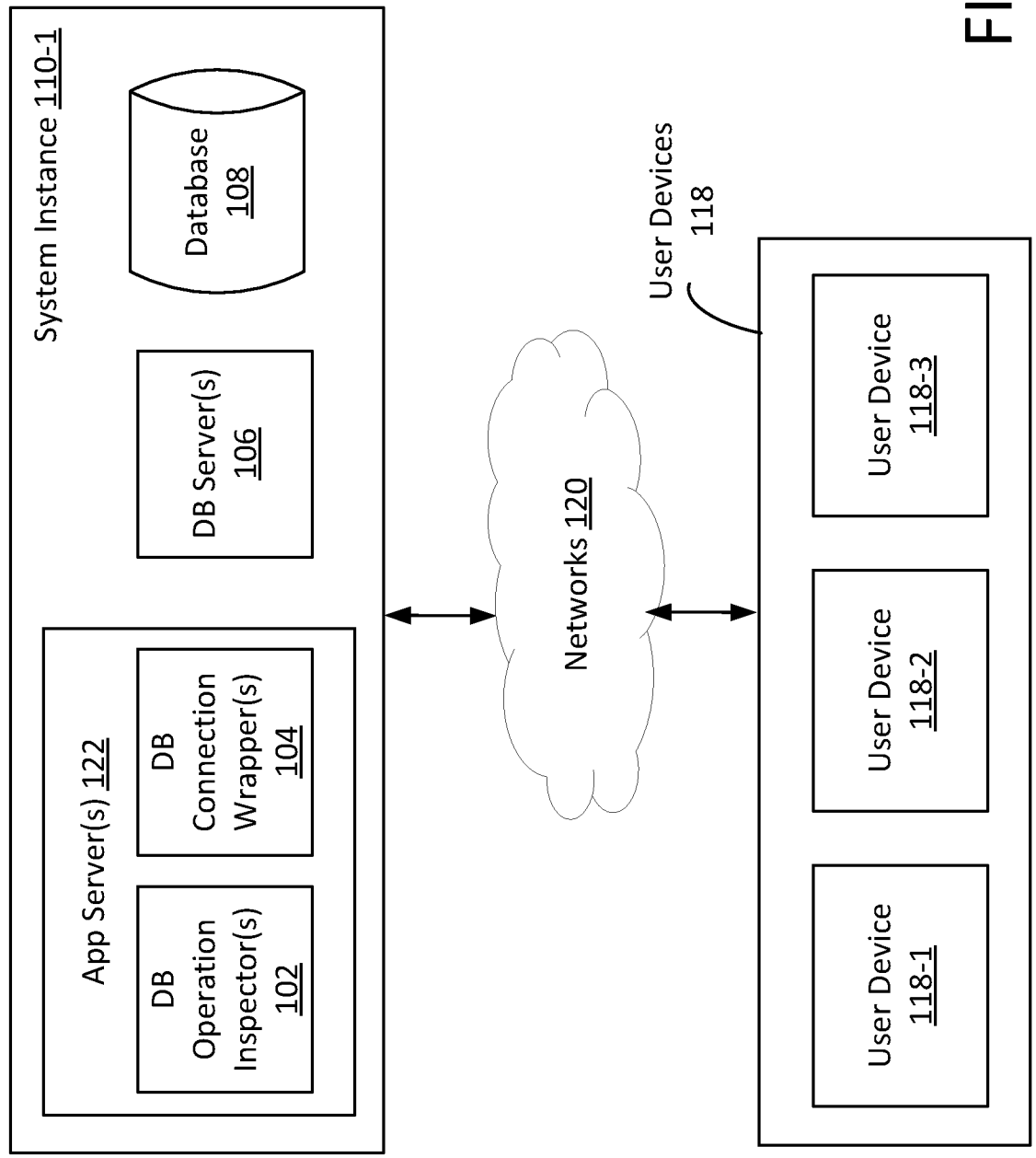
FIG. 1B illustrates an example system configuration for performing database operations.

FIG. 1B illustrates an example system configuration for performing database operations requested from user devices (e.g., 118, etc.) to store and retrieve columnar compressed data to and from a database 108 in a system instance (e.g., 110-1, etc.). Various system constituents as illustrated in FIG. 1B may be implemented through software, hardware, or a combination of software and hardware. Any, some or all of these system constituents may be interconnected and communicated directly, or through one or more networks (e.g., 120, etc.).

Database operations may be connected/related with user operations and/or user applications running at user devices, with platform operations and/or platform applications running at one or more subsystems or servers on the platform side of the multitenant computing system, etc. Additionally, optionally or alternatively, database operations as described herein may be connected/related with external system operations and/or external applications running at one or more external systems external (e.g., remote, etc.) to the multitenant computing system.

In some embodiments, the system instance (110-1) may comprise one or more application servers 122, one or more database servers 106, etc. The one or more application servers may in turn comprise one or more database (DB) operation inspectors 102, one or more DB connection wrappers 104, etc.

In some operational scenarios, an application server (e.g., among the one or more application servers (122), etc.), or a DB operation inspector (e.g., among the one or more DB operation inspectors (102), etc.) therein, receives a request for performing a database operation. The requested database operation may, but is not necessarily limited to only, be a data storing operation, a data retrieval operation, and so forth.

The request for the database operation can specify a number of request related attendant information items. In an example, the request for the database operation may include a proxy database statement defining or specifying the database operation and attendant information items. In another example, the request for the database operation may be made or sent by way of invoking a function call (e.g., an application server application programming interface (API) call, etc.) defining or specifying the database operation and attendant information items.

In some operational scenarios, in response to receiving the request for the database operation from a requesting entity (e.g., user device, platform service, etc.), the DB operation inspector in the application server determines whether the requested database operation is a data storing operation, a data retrieval operation, etc.

In response to determining that the requested database operation is a data storing operation, the application server, or the DB operation inspector therein, can proceed to identify/determine, based at least in part on the information items of the request, (1) a database table into which data/information derived from the request for the database operation is to be stored, (2) zero or more table columns (of the database table) for which columnar compression is to be performed, (3) columnar compression metadata that can be used in performing columnar compression and decompression, etc.

The DB operation inspector can provide or send some or all of the foregoing data/information in connection with the request for the database operation (a data storing operation in the present example) to a DB connection wrapper (e.g., among the one or more DB connection wrappers (104), etc.) in the application server.

To carry out the requested data storing operation, the DB connection wrapper may use some or all of the data/information received from the DB operation inspector to secure a database connection (object) with a database server (e.g., among the one or more database servers (106), etc.). The database connection may be obtained by the application server, or the DB connection wrapper therein, on the fly by invoking a function call (e.g., a database server API call, etc.), as an existing connection in a connection pool available to the application server, and so forth.

The DB connection wrapper under techniques as described herein uses some or all of the data/information received from the DB operation inspector to perform columnar compression operations to generate columnar compressed columnar values to be persisted in the database (108). In addition, the DB connection wrapper may generate a DB statement to carry out the requested data storing operation by way of the database server; pass or send, to the database server, the DB statement along with the columnar compressed columnar values to be persisted in the database (108); etc. The DB statement and some or all of the compressed columnar values (and/or any other uncompressed columnar values for table columns that are not designated for columnar compression) to be persisted in the database (108) may be set in the (e.g., non-proxy, etc.) database connection secured by the application server.

Upon or after receiving the DB statement and the columnar compressed columnar values (and/or any other uncompressed columnar values for table columns that are not designated for columnar compression) to be persisted in the database (108), the database engine in the database server invokes database IO operations (e.g., SAN IO operations, etc.), based at least in part on the DB statement, to store or persist some or all of the columnar compressed columnar values (and/or any other uncompressed columnar values for table columns that are not designated for columnar compression) as received from the application server.

Additionally, optionally or alternatively, one or more other attendant or temporary database objects, database procedures, etc., may be used to help carry out the data storing operation as described herein.

In some operational scenarios, in response to receiving the request for the database operation from a requesting entity (e.g., user device, platform service, etc.), the DB operation inspector in the application server determines that the requested database operation is a data retrieval operation.

In response to determining that the requested database operation is a data retrieval operation, the DB operation inspector proceeds to identify/determine, based at least in part on the request and attendant information items, (1) a database table from which data/information is to be retrieved for the requested data retrieval operation, (2) zero or more table columns (of the database table) from which columnar compressed data is to be retrieved for the requested data retrieval operation, (3) columnar compression metadata that can be used in performing columnar compression and decompression, etc.

The DB operation inspector in the application server can then provide or send some or all of request information as received in the request for the database operation (a data retrieval operation in the present example) to a DB connection wrapper (e.g., among the one or more DB connection wrappers (104), etc.) in the application server.

To carry out the requested data retrieval operation, the DB connection wrapper uses some or all of the request information received from the DB operation inspector to secure a database connection (object) with a database server (e.g., among the one or more database servers (106), etc.). The database connection may be obtained by the DB connection wrapper on the fly by invoking a function call (e.g., a database server API call, etc.), as an existing connection, for example in a connection pool available to the application server, and so forth.

The DB connection wrapper may use some or all of the request information received from the DB operation inspector to generate a DB statement to carry out the requested data retrieval operation by way of the database server; pass or send, to the database server, the DB statement; etc.

Upon receiving the DB statement and any attendant data/information in connection with the DB statement, the database server, or the database engine therein, may invoke database IO operations (e.g., SAN IO operations, etc.), based at least in part on the DB statement, to retrieve some or all of the data/information persisted with the database table in the database (108).

Subsequently, the application server, or the DB connection wrapper therein, receives a result set that comprises (e.g., data pointers to, etc.) the persisted data/information retrieved from the database table as maintained in the database (108). The persisted data/information from the database table (and/or any other uncompressed columnar values for table columns that are not designated for columnar compression) as retrieved by way of the result set may comprise, but is not necessarily limited to only, columnar compressed data retrieved from the one or more table columns of the database table.

In some operational scenarios, the application server, or the DB connection wrapper therein, may perform columnar decompression operations to generate uncompressed columnar values from the data/information retrieved from the database table. The application server, or the DB operation inspector therein, may then provide or send the uncompressed columnar values (and/or any other uncompressed columnar values for table columns that are not designated for columnar compression) in a response to a request entity (e.g., a user operation, a user application, a user device, etc.) initiating the request for the data retrieval operation.

In some operational scenarios, the application server, or the DB connection wrapper therein, may perform no or little columnar decompression operations on the data/information retrieved from the database table, even if the retrieved data/information includes columnar compressed columnar values to be persisted in the database (108). The application server, or the DB operation inspector therein, may provide or send the data/information including but not necessarily limited to only the columnar compressed columnar values in a response to a request entity (e.g., a user operation, a user application, a user device, etc.) initiating the request for the data retrieval operation. The columnar compressed columnar values (and/or any other uncompressed columnar values for table columns that are not designated for columnar compression) may be further processed (e.g., perform columnar decompression operations, etc.) by the request entity or processing entities in connection with the request entity.

Additionally, optionally or alternatively, one or more other attendant or temporary database objects, database procedures, etc., may be used to help carry out the data retrieval operation as described herein.

2.2 Writing and Reading Columnar Compressed Data

General compression methods adopted by database technologies such as data block level compression methods, row-level compression methods, and so forth, are not efficient as a data block or a row comprise data of different data types. Even if two or more table columns of the database table are of the same data type, actual data value instances and distribution thereof in these table columns may be very different. Thus, the general compression methods that do not implement columnar compression/decompression techniques as described herein would typically incur very high computational costs while achieving relatively low efficiency in data compression results.

In contrast, columnar compression/decompression under techniques as described herein can be applied to compress columnar data maintained (e.g., persisted, cached, etc.) in a database table in a highly efficient manner in terms of computational costs, compression results, etc.

As illustrated in FIG. 2A, a database table may logically comprise a plurality of table columns such as "c1", "c2", "c3", "cn", and so forth. These table columns may have same or different date types (e.g., different column data types, different data types, etc.) respectively. For example, the "c1" table column may represent a first table column (of the database table and of a first data type denoted as "d1") to store city names in English. The "c2" table column may represent a second table column (of the database table and of a second data type denoted as "d2") to store zip codes in numerals. The "c3" table column may represent a third table column (of the database table and of a third data type denoted as "d3") to store attributes of cities identified in the first and second table columns. As used herein, a table column as described herein may be of a single data type such as number, date, time, text, strings, blobs, hyperlinks, a simple data type, a complex data type, a system-defined data type, a user-defined data type, etc. Columnar compression/decompression operations store/retrieve columnar data of a database table column by column rather than row by row. As columnar data of a table column is of the same data type, storing and retrieving columnar data column by column supports relatively high computational and compression/decompression efficiencies as compared with storing and retrieving row data of mixed data types row by row.

Columnar compression techniques as described herein can coexist and operate in conjunction with a wide variety of available database types such as those related to: relational databases, non-relational databases, object-based databases, hierarchical databases, file-based databases, stream-based databases, cloud-based databases, decision support system (DSS) databases, data warehouses, etc. These techniques may be implemented by systems, devices, processes, etc., external to a database system or database servers operating with the database system.

For example, as discussed previously, application servers located externally to database servers may be used to implement some or all of the columnar compression techniques. The application servers may compress and/or decompress data/information to and/or from database tables persisted in a database (e.g., 108 of FIG. 1B, etc.) without requiring the database servers to perform these columnar compression and decompression operations. As a result, in some embodiments, there is no need to alter the functionality of the database servers and/or the database system as provided by a (or any) database system vendor. In addition, since the compressed columnar values are of much smaller data sizes than uncompressed columnar values, the database servers and the database can handle storing and retrieving the compressed columnar values with much less computational costs and much less database I/O capacity usages. As used herein, (compressed or decompressed) columnar values of a table column of a database table refer to some or all column values of the table column as compressed into or decompressed from one or more compression data units that are compressed, decompressed, stored and retrieved separately from column values of other table columns in the database table.

2.3 Data Storing Operations

Figure 3A:
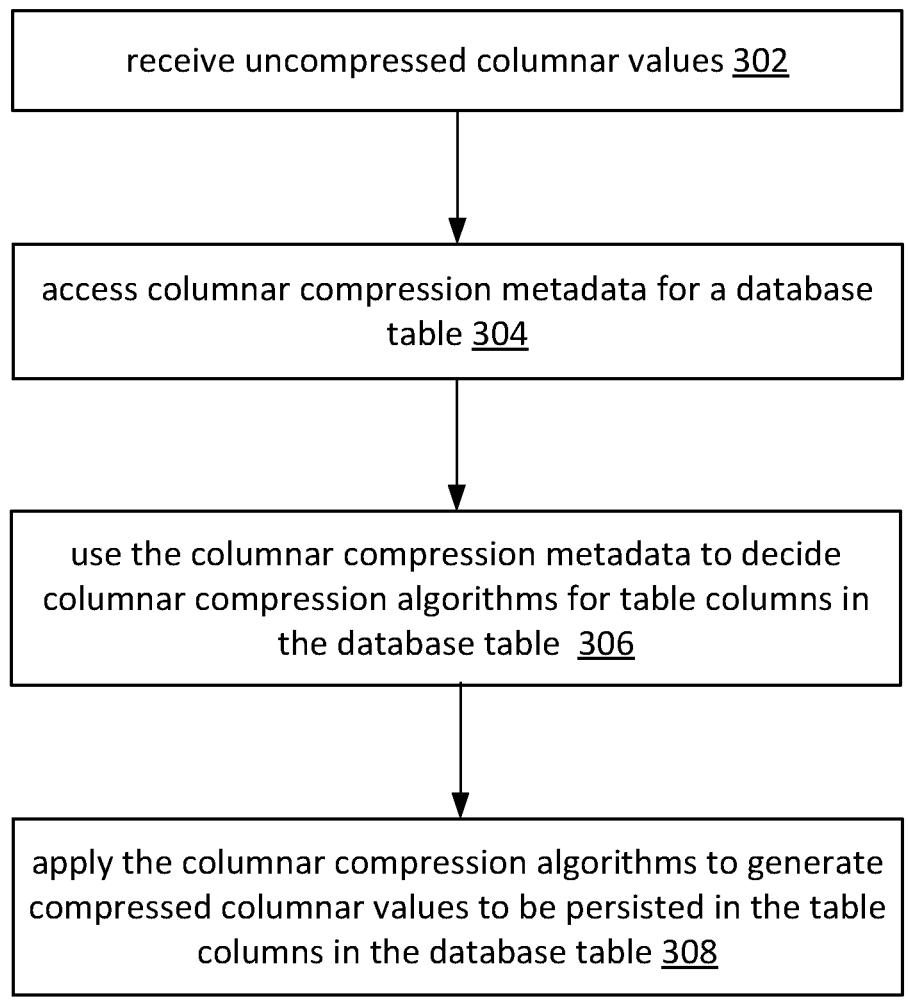
FIG. 3A through FIG. 3E illustrate example methods for data storing and retrievals.

FIG. 3A illustrates an example columnar compression process flow, which may (but is not limited to) be performed as a part of data storing operations. The process flow may be implemented by one or more computing devices such as a columnar compression/decompression system comprising a database server, an application server, a combination of database and application servers, etc., as described herein.

In block 302 of FIG. 3A, uncompressed columnar values—from which columnar compressed columnar values is to be derived for storing into a database table (e.g., 202 of FIG. 2A, etc.) in a database (e.g., 108 of FIG. 1B, etc.)—is received or intercepted, for example by an application server or a DB operation inspector therein.

In block 304 of FIG. 3A, the application server accesses columnar compression metadata (e.g., 204 of FIG. 2B, etc.) for the database table (202). The columnar compression metadata (204) may be specified or configured for the database table (202) in advance or on the fly while the requested data storing operation is being performed.

Some or all of compression-related metadata in the columnar compression metadata (204) may be pre-defined, pre-configured, etc. Additionally, optionally or alternatively, some or all of compression-related metadata in the columnar compression metadata (204) may be dynamically defined, dynamically configured, dynamically updated, etc., for example while data storing and retrieval operations are being handled by a system implementing and/or performing columnar compression and decompression operations as described herein.

As illustrated in FIG. 2B, the columnar compression metadata (204) may comprise column identification information (denoted as "col. ID"), columnar compression method information (denoted as "comp. method"), columnar compression operational metadata (denoted as "comp. op metadata"), and so forth.

The application server uses the column identification information ("col. ID") to identify one or more table columns (and/or their respective data/column types) of the database table (202) for columnar compression operations; uses the columnar compression method information ("comp. method") to identify one or more specific columnar compression methods (or one or more columnar decompression methods in the case of data retrieval operations) to be used for performing columnar compression operations (or columnar decompression operations in the case of data retrieval operations) on the received uncompressed columnar values (or database retrieved compressed columnar values in the case of data retrieval operations); uses the columnar compression operational metadata to perform substitutions or conversions between the uncompressed columnar values and the compressed columnar values; etc.

Example compression/decompression methods/algorithms identified in the columnar compression metadata (204) may include, but are not necessarily limited to only, any of: dictionary encoding methods/algorithms, null suppression methods/algorithms, Lempel-Ziv encoding methods/algorithms, run length encoding methods/algorithms, hybrid columnar compression methods/algorithms, Huffman encoding methods/algorithms, etc.

For example, the "c1" table column of the database table (202) may store city names. In the columnar compression metadata (204) specified/configured for the database table (202), a specific columnar compression method/algorithm such as a specific dictionary encoding method/algorithm may be specified in the "comp. method" field for the "c1" table column.

Additionally, optionally or alternatively, a specific columnar compression dictionary (e.g., 206-1 of FIG. 2C, 206-2 of FIG. 2D, etc.) may be specified as columnar compression operational metadata (in the "comp. op metadata" field) to control the manner in which the specific dictionary encoding method/algorithm operates to compress the received uncompressed columnar values for the "c1" table column.

It should be noted that, under techniques as described herein, two different table columns even of the same data type (e.g., text, etc.) may be compressed by different columnar compression methods/algorithms and/or the same compression method/algorithm but operated/controlled with different columnar operational metadata.

In an example, a first text table column storing city names in English in a database table may be compressed with a first compression method/algorithm, whereas a second text table column storing person names in English in the database table may be compressed with a second compression method/algorithm different from the first compression method/algorithm.

In another example, a third text table column storing city names in English in a database table may be compressed with a compression method/algorithm operated/controlled with first compression operational metadata (e.g., English-based dictionary, English-based lookup table, etc.), whereas a fourth text table column storing city names in Spanish in the database table may be compressed with the same compression method/algorithm operated/controlled with first compression operational metadata (e.g., Spanish-based dictionary, Spanish-based lookup table, etc.).

FIG. 2C illustrates example columnar compression operational metadata 206-1 that comprises mappings between uncompressed column values and compressed column values. For the purpose of illustration only, the uncompressed column values may be city names, whereas the compressed column values may be numbers to which the city names are respectively mapped. The city names in their uncompressed form as indicated in the uncompressed column values may be a string or text value, and thus may each be represented by multiple bytes. In contrast, the numbers—as indicated in the compressed column values—to which the city names are respective mapped by the columnar compression operational metadata may be represented in a much more spatially compact form (e.g., a numeric or index value sufficiently compact to store 20 different numbers respectively for 20 different city names, a single byte, a small integer, etc.).

In some embodiments, the columnar compression operational metadata (e.g., 206-1, 206-2, etc.) as pointed to by columnar compression metadata (e.g., 204 of FIG. 2B, etc.) may be created, generated, updated, deleted, modified, etc., in advance before columnar compression operations based at least in part on the columnar compression operational metadata (e.g., 206-1, 206-2, etc.) are performed.

Additionally, optionally or alternatively, the columnar compression operational metadata (e.g., 206-1, 206-2, etc.) as pointed to by columnar compression metadata (e.g., 204 of FIG. 2B, etc.) may be (e.g., dynamically, programmatically, with no or little user interactions, with user interactions, etc.) created, generated, updated, deleted, modified, etc., while columnar compression operations based at least in part on the columnar compression operational metadata (e.g., 206-1, 206-2, etc.) are being performed.

Columnar compression metadata (including but not necessarily limited to only columnar compression operational metadata) may be accessible to a system as described in any combination of a wide variety of ways. Columnar compression metadata such as 204 of FIG. 2B may be stored in a first columnar compression metadata table or a first metadata structure, whereas columnar compression operational metadata (e.g., dictionary, etc.) such as 206-1 of FIG. 2C or 206-2 of FIG. 2D may be stored in a second columnar compression metadata table or a second metadata structure.

Some or all of columnar compression metadata may be stored locally or remotely to one or more application servers or other operational entities that need to access the columnar compression metadata for performing columnar compression operations as described herein.

In an example, some or all of columnar compression metadata may be stored in one or more database tables in a database, which may be separate from the (target) database table for which columnar compression operations based at least in part on the columnar compression metadata are to be performed.

Additionally, some or all of columnar compression metadata may be cached or persisted locally in data tables, data structures, memory heaps, lookup tables, etc., to the application servers or other operational entities that need to access the columnar compression metadata for performing columnar compression operations as described herein.

In block 306 of FIG. 3A, the application server uses the columnar compression method information stored in the columnar compression metadata (204 of FIG. 2B) for the database table (202) to decide one or more columnar compression methods/algorithms (e.g., one method/algorithm for city names while another method/algorithm for zip codes, etc.) for one or more table columns in the database table (202). Additionally, optionally or alternatively, the application server uses the columnar compression operational metadata information stored in the columnar compression metadata (204 of FIG. 2B) for the database table (202) to identify respective compression operational metadata to be used in the one or more columnar compression methods/algorithms for generating compressed columnar values in the one or more table columns in the database table (202) from the received uncompressed columnar values.

In block 308 of FIG. 3A, the application server applies the one or more columnar compression methods/algorithms to generate compressed columnar values to be persisted in the one or more table columns in the database table (202). Additionally, optionally or alternatively, the application server uses the columnar compression operational metadata (e.g., operational parameters, operational data constructs, etc.) to respectively control how the one or more columnar compression methods/algorithms operate. The compressed columnar values for the one or more table columns of the database table (202) and any other data/information for any other table columns of the database table (202) not designated for columnar compression may be persisted by the application server in the database (108) by way of a database server operating in conjunction with the application server.

In some embodiments, some or all of the received uncompressed columnar values may be substituted with the compressed columnar values. The application server may use a DB connection wrapper (object) to perform some or all of the columnar compression operations and the data storing operation as described herein. The DB connection wrapper may be initialized, created, generated, etc., using a database connection (object) secured/obtained from a database server. The DB connection wrapper supports some or all functionality available from the database connection returned by the database server, as well as additional functionality that implements the columnar compression operations related to the data retrieval operation as described herein.

Example columnar compression operations related to data storing operations may include, but are not necessarily limited to only, any of: performing data substitution (from uncompressed columnar values as received to corresponding compressed columnar values to be persisted), updating columnar compression metadata (including but not necessarily limited to only columnar compression operational metadata), rewriting database statements as appropriate, etc.

The columnar compression method/algorithm may order the compressed columnar values in a specific order. For example, city names in a table column is to be arranged/stored or retrieved in a specific order. The columnar compression method/algorithm may implement order processing logic to take it into account that input city names may not be properly ordered, to sort the unordered input city names into ordered city names, to perform data substitution, compression and/or storing while maintaining the specific order, etc.

In some embodiments, the application server receives an input proxy database statement (e.g., via an API call invoked by a user application, etc.) accompanying the uncompressed columnar values.

Under techniques as described herein, in some operational scenarios, the input proxy database statement as received by the application server may not be directly passed by the application server to the database server through the data connection.

In an example, the proxy database statement may refer to or use proxy table columns (e.g., a "CityName" column that does not exist in the database table (202), etc.) that may or may not exist in the database table (202). Thus, if the proxy database statement is passed through the database connection to the database server, then an error may be returned as the proxy database statement may refer to non-existing table columns in the database table (202).

Instead of directly passing the proxy database statement to the database server, the application intercepts or inspects the proxy database statement and use the columnar compression metadata to convert the proxy database statement into a target database statement that is passed by the application server to the database server. The target database statement replaces the proxy table columns (e.g., the "CityName" column, etc.) that does not exist in the database table (202) with corresponding target table columns (e.g., the "c1" column, etc.) that do exist in the database table (202). The target database statement is then passed by the application server through the database connection to the database server.

In another example, the proxy database statement may refer to or use proxy data types (e.g., a text data type for the "c1" column in the database table (202), etc.) that may be incorrect in the database table (202). Thus, if the proxy database statement is passed through the database connection to the database server, then an error may be returned as the proxy database statement may refer to incorrect data types for table columns in the database table (202).

Instead of directly passing the proxy database statement to the database server, the application intercepts or inspects the proxy database statement and use the columnar compression metadata to perform columnar compression operations that convert the proxy database statement into a target database statement that is passed by the application server to the database server. The target database statement replaces the uncompressed columnar values of the data types that are incorrect for table columns in the database table (202) with compressed columnar values of the data types that are correct for the table columns (designated for columnar compression) in the database table (202). The target database statement is then passed by the application server through the database connection to the database server.

In some operational scenarios—e.g., where the application server determines that incoming data as received cannot be successfully matched with expected data type or expected table columns, cannot be properly compressed, converted or substituted, etc.,—the application server may write the incoming data in a separate table column, in a separate database table, etc.

2.4 Data Retrieval Operations

Figure 3B:
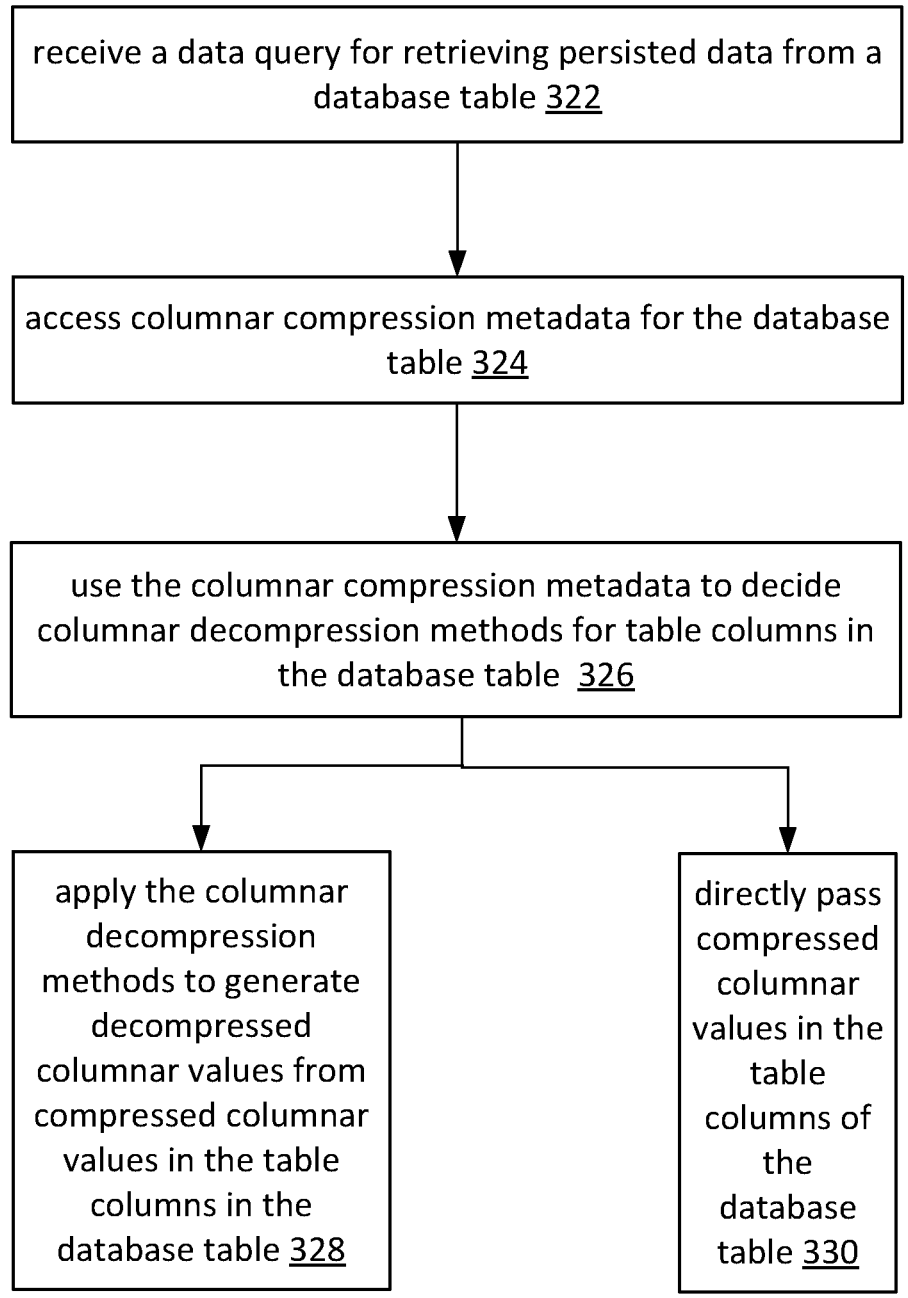

FIG. 3B illustrates an example columnar decompression process flow, which may (but is not limited to) be performed as a part of data retrieval operations. The process flow may be implemented by one or more computing devices such as a columnar compression/decompression system comprising a database server, an application server, a combination of database and application servers, etc., as described herein.

In block 322 of FIG. 3B, a data query for retrieving data/information from a database table (e.g., 202 of FIG. 2A, etc.) in a database (e.g., 108 of FIG. 1B, etc.) is received or intercepted, for example by an application server or a DB operation inspector therein.

In block 324 of FIG. 3B, the application server accesses columnar compression metadata (e.g., 204 of FIG. 2B, etc.) for the database table (202) to identify a subset of table columns in all the table columns of the database table (202). The subset of table columns stores compressed columnar values. Zero or more other table columns in all the table columns of the database table (202) store uncompressed columnar values.

In block 326 of FIG. 3B, the application server uses the columnar compression method information stored in the columnar compression metadata (204 of FIG. 2B) for the database table (202) to decide one or more columnar decompression methods/algorithms (e.g., one method/algorithm for the "c1" column storing compressed columnar values about city names while another method/algorithm for the "c2" column storing compressed columnar values about zip codes, etc.) for one or more table columns in the database table (202). Additionally, optionally or alternatively, the application server uses the columnar compression operational metadata information stored in the columnar compression metadata (204 of FIG. 2B) for the database table (202) to identify respective decompression operational metadata to be used in the one or more columnar decompression methods/algorithms for generating corresponding decompressed (or uncompressed) columnar values from the compressed columnar values in the one or more table columns in the database table (202).

In block 328 of FIG. 3B, the application server applies the one or more columnar decompression methods/algorithms to generate the decompressed (or uncompressed) columnar values from the compressed columnar values in the one or more table columns in the database table (202). Additionally, optionally or alternatively, the application server uses the columnar compression operational metadata (e.g., operational parameters, operational data constructs, etc.) to respectively control how the one or more columnar decompression methods/algorithms operate. The decompressed (or uncompressed) columnar values derived from the compressed columnar values persisted in the one or more table columns of the database table (202) and any other data/information for any other table columns (not designated for columnar compression) of the database table (202) may be sent by the application server to a data retrieval entity initiating the data retrieval operations as described herein as a response to the data query received in block 322.

In some embodiments, some or all of the retrieved compressed columnar values may be substituted with the decompressed (or uncompressed) columnar values, for example based on the columnar compression operational metadata (e.g., through reverse look up operations in a dictionary for uncompressed columnar values such as city names and corresponding compressed columnar values, etc.). The application server may use a DB connection wrapper (object) to perform some or all of the columnar decompression operations and the data retrieval operation as described herein. The DB connection wrapper may be initialized, created, generated, etc., using a database connection (object) secured/obtained from a database server. The DB connection wrapper support some or all functionality available from the database connection returned by the database server, as well as additional functionality that implements the columnar compression operations related to the data storing operation as described herein.

Example columnar decompression operations related to data retrieval operations may include, but are not necessarily limited to only, any of: performing data substitution (from compressed columnar values as retrieved from the database table (202) to corresponding uncompressed columnar values to be provided to a requesting entity), rewriting database statements as appropriate, etc.

The columnar decompression method/algorithm may order the decompressed (or uncompressed) columnar values in a specific order. For example, city names in a table column is to be arranged/stored or retrieved in a specific order. The columnar decompression method/algorithm may implement order processing logic to sort the city names based on an order specified in a dictionary, based on an order specified with a primary key of the database table (202), etc.

In some embodiments, instead of generating the decompressed (or uncompressed) columnar values from the compressed columnar values in the one or more table columns in the database table (202) (as illustrated in block 328 of FIG. 3B), in block 330 of FIG. 3B, the application server directly pass the compressed columnar values persisted in the one or more table columns of the database table (202) and any other data/information for any other table columns (not designated for columnar compression) of the database table (202) to a data retrieval entity initiating the data retrieval operations as described herein as a response to the data query received in block 322. The requesting entity or processing entities operating in conjunction with the requesting entity can access the columnar compression metadata, and apply columnar compression operations to derive decompressed (or uncompressed) columnar values from the retrieved compressed columnar values persisted in the one or more table columns of the database table (202) and any other data/information for any other table columns (not designated for columnar compression) of the database table (202).

In some embodiments, the application server receives an input proxy database statement (e.g., via an API call invoked by a user application, etc.) as a part of the data query (or a request for a data retrieval operation).

Under techniques as described herein, in some operational scenarios, the input proxy database statement as received by the application server may not be directly passed by the application server to the database server through the data connection.

For example, the proxy database statement may refer to or use proxy table columns (e.g., a "CityName" column that does not exist in the database table (202), etc.) that may or may not exist in the database table (202). Thus, if the proxy database statement is passed through the database connection to the database server, then an error may be returned as the proxy database statement may refer to non-existing table columns in the database table (202).

Instead of directly passing the proxy database statement to the database server, the application intercepts or inspects the proxy database statement and use the columnar compression metadata to convert the proxy database statement into a target database statement that is passed by the application server to the database server. The target database statement replaces the proxy table columns (e.g., the "CityName" column, etc.) that does not exist in the database table (202) with corresponding target table columns (e.g., the "c1" column, etc.) that do exist in the database table (202). The target database statement is then passed by the application server through the database connection to the database server.

2.5 Example Implementations

Figure 3C:
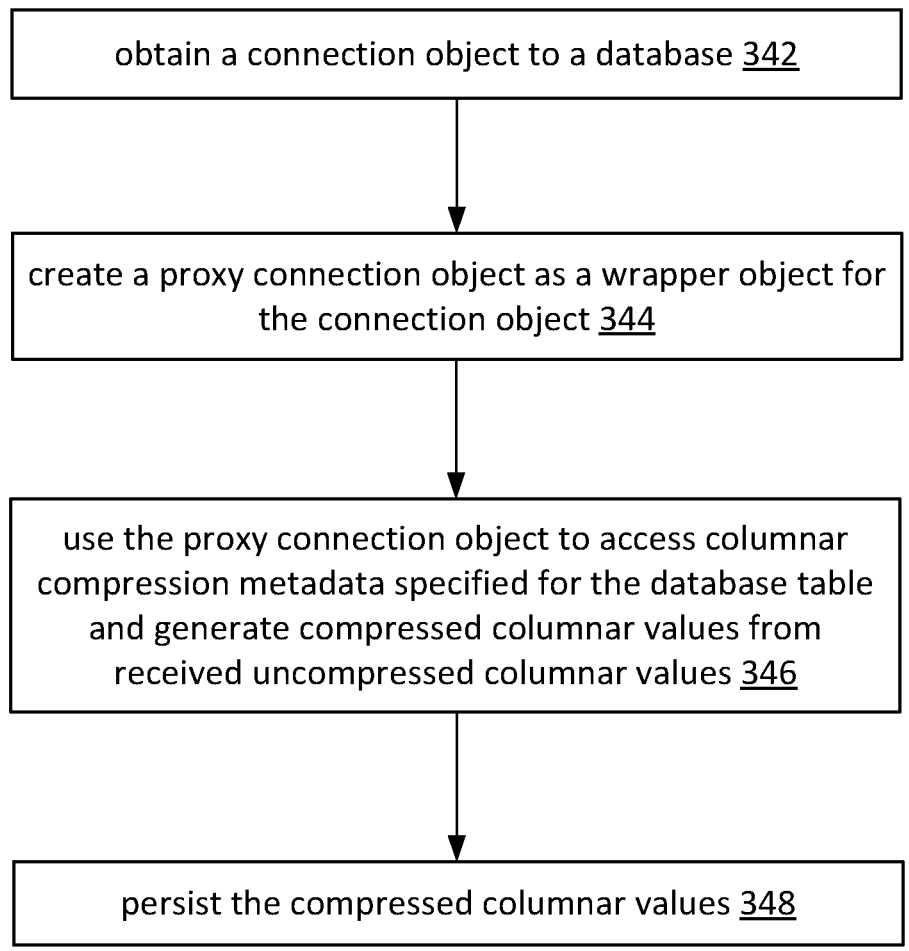

FIG. 3C illustrates an example method for writing compressed data such as columnar compressed values to a database table (e.g., 202 of FIG. 2A, etc.) in a database (e.g., 108 of FIG. 1B, etc.).

In block 342, a connection object is obtained (e.g., by an application server, etc.) to the database (108) (e.g., by way of a database server, etc.). The connection object may be generated or obtained—for example in response to receiving uncompressed columnar values from which compressed columnar values are to be derived and persisted in the database table (202) in the database (108)—from a connection object factory (or holder) implemented by an application server, a database server, etc.

In block 344, a proxy connection object is created as a wrapper object for the (non-proxy) connection object. The wrapper object maintains access to the all the functionality supported by the (non-proxy) connection object as well as implements additional functionality supporting columnar compression operations. The proxy connection object may be generated or obtained from a proxy connection object factory (or holder) implemented by the application server, the database server, etc.

In some embodiments, the proxy connection object factory (or holder) returns the proxy connection object with a proxy database statement. The proxy database statement may indicate to the application server: which table columns in the database table (202) are designated for columnar compression, which table columns in the database table (202) are designated not for columnar compression, what incoming data types (data types for the received uncompressed columnar values) respectively for the table columns that are designated for columnar compression, what target data types (data types as defined for the table columns in database schema) respectively for the table columns that are designated for columnar compression, and so forth.

In block 346, the application server uses the proxy connection object, or the proxy database statement therein, to access columnar compression metadata specified for the database table (202); use the columnar compression metadata to identify which table columns in the database table (202) are designated for columnar compression; inspect some or all of the received uncompressed columnar values; apply one or more specific columnar compression methods or schemes (e.g., dictionary-based compression, run-length-based compression, Lempel-Ziv-Welch or LZW compression, other lossless data compression, etc.) to the uncompressed columnar values to generate compressed columnar values to be persisted in the database table (202) in the database (108).

As a part of columnar compression operations, relevant metadata tables or data structures (contents thereof) in some or all of the columnar compression metadata may be updated. For example, in case of dictionary-based compression, a symbol mapping table may be updated (e.g., appended with new dictionary entries or with new mapping entries between uncompressed columnar values and compressed columnar values, etc.).

In block 348, the application server sets up a database statement (e.g., a prepared statement, a callable statement, etc.) with the compressed columnar values (and/or any other uncompressed columnar values for any other table columns in the database table (202) that are not designated for columnar compression). For example, the application server may use the proxy statement to replace the uncompressed columnar values with the corresponding compressed columnar values (or values in compression representations) and generate the database statement. The compressed columnar values (and/or any other uncompressed columnar values for any other table columns in the database table (202) that are not designated for columnar compression) are then written into the database table (202) in the database (108) with the database statement, for example by passing the database statement and the to-be-written data in the (non-proxy) connection object.

Figure 3D:
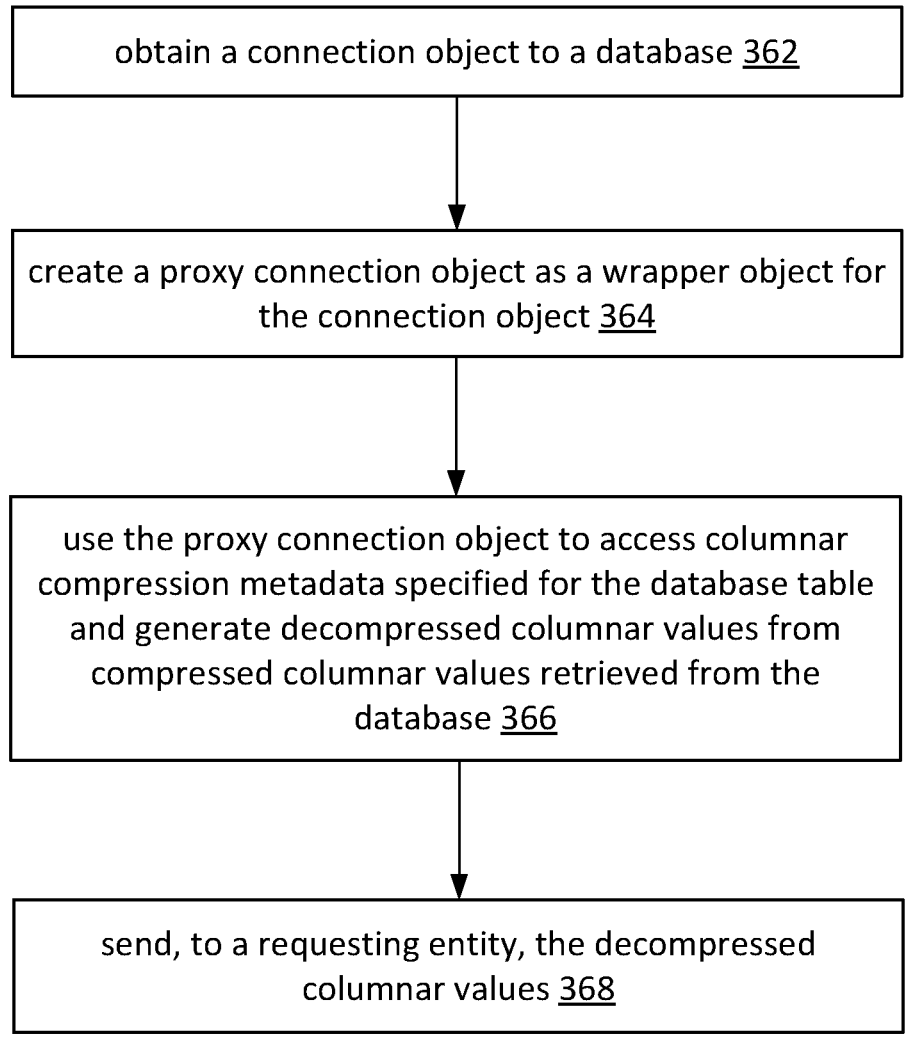

FIG. 3D illustrates an example method for reading compressed data such as columnar compressed values from a database table (e.g., 202 of FIG. 2A, etc.) in a database (e.g., 108 of FIG. 1B, etc.).

In block 362, a connection object is obtained (e.g., by an application server, etc.) to the database (108) (e.g., by way of a database server, etc.). The connection object may be generated or obtained—for example in response to receiving a data query in connection with columnar compressed values in one or more table columns (and other uncompressed values for other table columns not designated for columnar compression) in the database table (202) in the database (108)—from a connection object factory (or holder) implemented by an application server, a database server, etc.

In block 364, a proxy connection object is created as a wrapper object for the (non-proxy) connection object. The wrapper object maintains access to the all the functionality supported by the (non-proxy) connection object as well as implements additional functionality supporting columnar decompression operations. The proxy connection object may be generated or obtained from a proxy connection object factory (or holder) implemented by the application server, the database server, etc.

In some embodiments, the proxy connection object factory (or holder) returns the proxy connection object with a proxy database statement. The proxy database statement may indicate to the application server which table columns in the database table (202) are designated for columnar compression, which table columns in the database table (202) are designated not for columnar compression, what outgoing data types (data types for uncompressed columnar values to be generated from the compressed columnar persisted in the table columns) respectively for the table columns that are designated for columnar compression, what origination data types (data types as defined for the table columns in database schema) respectively for the table columns that are designated for columnar compression, and so forth.

In block 366, the application server uses the proxy connection object to access columnar compression metadata specified for the database table (202); inspect all retrieved columnar values from the database table (202) through a result set data values; use the columnar compression metadata to identify which table columns have been compressed, what columnar compression method/scheme was used to generated persisted compressed columnar values, etc.; perform a columnar decompression method/scheme (corresponding to the columnar compression method/scheme was used to generated persisted compressed columnar values) on the persisted compressed columnar values retrieved from the database table (202) to generate decompressed (or uncompressed) columnar values (and/or any other uncompressed columnar values for any other table columns in the database table (102) not designated for columnar compression).

In some embodiments, the application server, or a DB connection wrapper therein, may rewrite a query received from the request entity to a new query that joins a table (e.g., a dictionary table, 206-1 of FIG. 2C, 206-2 f FIG. 2D, etc.) as specified in the columnar compression metadata (or columnar compression operational metadata therein). The new query may return uncompressed columnar values (e.g., "city1", etc.) from the joined table instead of compressed columnar values (e.g., a compressed value of 1 for "city1", etc.).

In block 368, the application server sends, to the requesting entity that initiates/originates the data query, the decompressed columnar values (and/or any other uncompressed columnar values for any other table columns in the database table (202) that are not designated for columnar compression). For example, the application server may set up a proxy result set with the decompressed columnar values (and/or any other uncompressed columnar values for any other table columns in the database table (202) that are not designated for columnar compression) and pass the result set to the requesting entity.

Figure 3E:
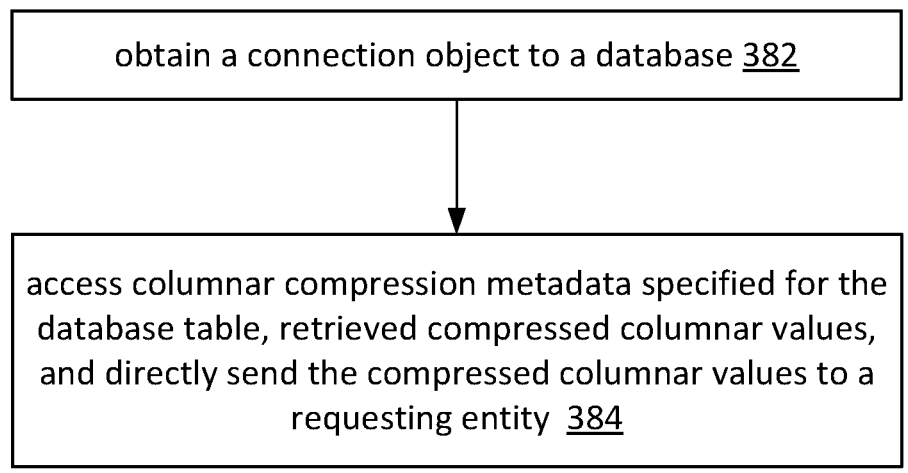

FIG. 3E illustrates an example method for reading compressed data such as columnar compressed values from a database table (e.g., 202 of FIG. 2A, etc.) in a database (e.g., 108 of FIG. 1B, etc.).

In block 382, a connection object is obtained (e.g., by an application server, etc.) to the database (108) (e.g., by way of a database server, etc.). The connection object may be generated or obtained—for example in response to receiving a data query in connection with columnar compressed values in one or more table columns (and other uncompressed values for other table columns not designated for columnar compression) in the database table (202) in the database (108)—from a connection object factory (or holder) implemented by an application server, a database server, etc.

In block 384, the application server accesses (e.g., by way of a proxy connection object created from the connection object, etc.) columnar compression metadata specified for the database table (202); directly sends, to the requesting entity that initiates/originates the data query, compressed columnar values (and/or any other uncompressed columnar values for any other table columns in the database table (202) that are not designated for columnar compression) retrieved from the database table (202) in the database (108). The application server may perform no columnar decompression operations but rather leave any compressed columnar values in a result set (e.g., directly from the database server, etc.) to be accessed and processed by the requesting entity that initiates/originates the data query.

In some operational scenarios, there exist one or more indexes on one or more compressed table columns of the database table (202). Columnar compression operations and/or columnar decompression operations may be performed in a manner that preserves a specific order as specified by an index in data storing operations and/or in data retrieval operations. Example specific orders as described herein may include, but are not necessarily limited to only, any of: an order according to an index based at least in part on an indexed column (e.g., the "c1" column of the database table (202), etc.) that stores compressed columnar values, an order according to an index based at least in part on an indexed column (e.g., a separate "PK" table column of the database table (202), etc.) that does not store compressed columnar values, etc.

In an example, in data storing operations, compressed columnar values of an indexed table column may be stored or persisted in the database table (202) in a specific order according to an ordered dictionary for one of table columns designated for columnar compression. Likewise, in data retrieval operations, decompressed columnar values generated from compressed columnar values retrieved from an indexed table column may be sorted and returned in a specific order according to the ordered dictionary.

By way of illustration but not limitation, in some operational scenarios, the columnar compression operational metadata (206-1) may represent an ordered dictionary if the compressed columnar values (in the right column) are sorted in a specific order. The specific order of this ordered dictionary may be used to sort to-be-persisted compressed columnar values in data storing operations, as well as to sort to-be-outputted decompressed columnar values in data retrieval operations.

In another example, a specific order to be observed by a data storing operation and/or a data retrieval operation as described herein may be specified or enforced by way of a primary key column other than (or separate from) table columns used to store compressed columnar values.

FIG. 2D illustrates example columnar compression operational metadata 206-2 that comprises a primary key column (denoted as "PK") as well as mappings between uncompressed column values and compressed column values. Different city names to corresponding compressed columnar values (e.g., numbers, indexes, etc.) may be given different primary key values "pk1", "pk2", "pk3", etc., in a specific order (e.g., an ascending or descending order among contiguous primary key values, etc.). In data storing operations, the columnar compression operational metadata (206-2) may be used by columnar compression operations to sort to-be-persisted compressed columnar values in a specific (e.g., descending, ascending, etc.) order of the primary key values in the primary key column of the columnar operational metadata (206-2). Likewise, in data retrieval operations, the columnar compression operational metadata (206-2) may be used by columnar decompression operations to sort to-be-outputted decompressed columnar values in a specific (e.g., descending, ascending, etc.) order of the primary key values in the primary key column of the columnar operational metadata (206-2).

In some embodiments, in a data retrieval operation, if the compressed columnar values as retrieved from the database table (202) are already ordered correctly, no sorting need be performed to order the to-be-outputted decompressed columnar values; simply substitutions of compressed columnar values with corresponding uncompressed columnar values as specified in columnar compression operational metadata (e.g., 206-1, 206-2, etc.) suffice.

On the other hand, if the compressed columnar values as retrieved from the database table (202) are not already ordered correctly, sorting may be applied to order the to-be-outputted decompressed columnar values. In addition to perform substitutions of compressed columnar values with corresponding uncompressed columnar values as specified in columnar compression operational metadata (e.g., 206-1, 206-2, etc.), ordering based on an ordered dictionary or an index (e.g., based on a primary key index, etc.) may be performed to sort the to-be-outputted decompressed columnar values.

3.0 EXAMPLE EMBODIMENTS

Figure 4A:
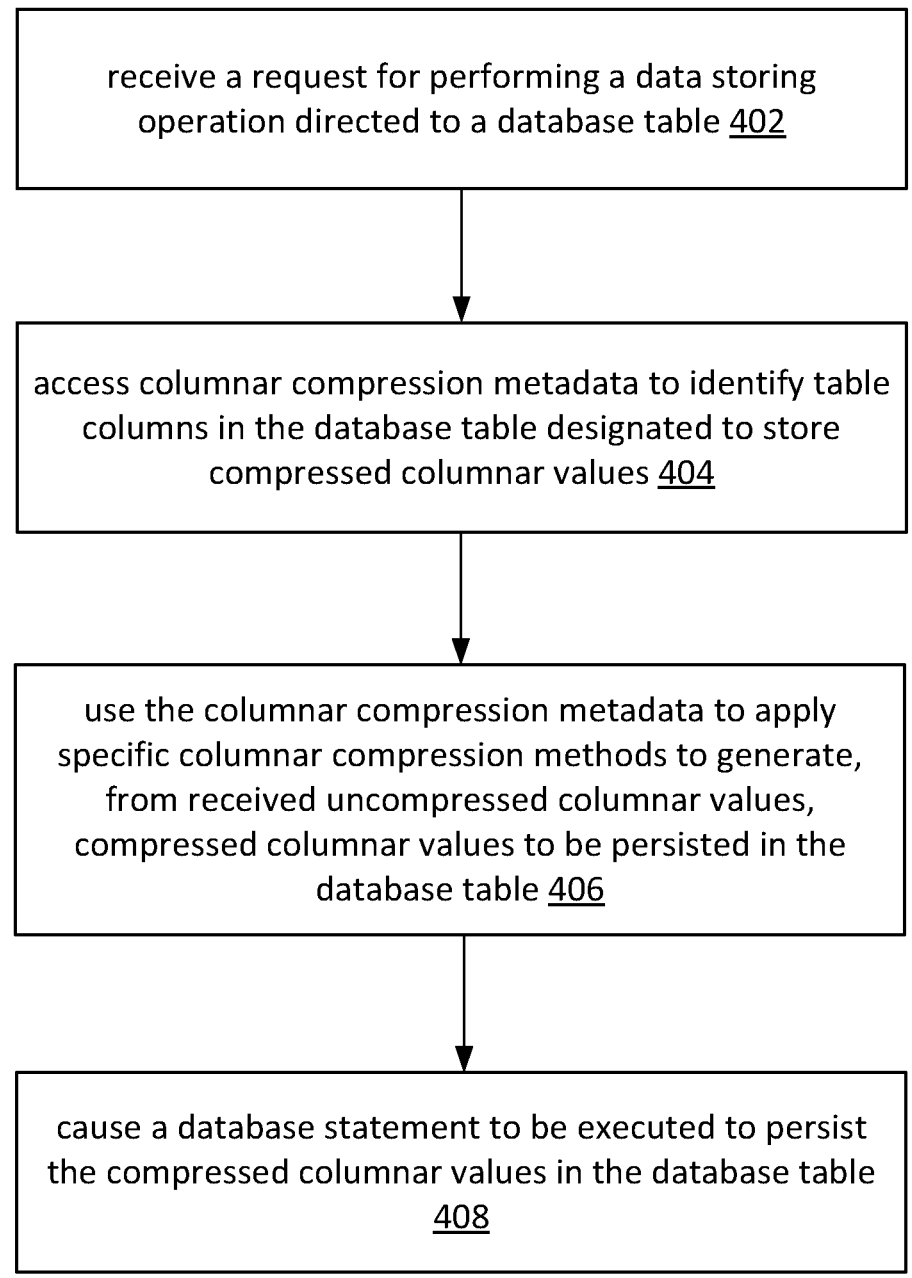
FIG. 4A and FIG. 4B illustrate example process flows.

FIG. 4A illustrates an example process flow that may be implemented by one or more computing devices such as a columnar compression system comprising a database server, an application server, a combination of database and application servers, etc., as described herein. In block 402, the system receives a request for performing a data storing operation directed to a database table that comprises a plurality of table columns.

In block 404, the system accesses columnar compression metadata to identify one or more table columns in the database table, each of the one or more table columns being designated to store compressed columnar values.

In block 406, the system generates, from one or more uncompressed columnar values received with the request for the data storing operation, one or more compressed columnar values by applying one or more columnar compression methods using the columnar compression metadata. The one or more compressed columnar values are to be persisted in the one or more table columns in the database table.

In block 408, the system causes a database statement to be executed to persist the one or more compressed columnar values in the one or more table columns in the database table.

Figure 4B:
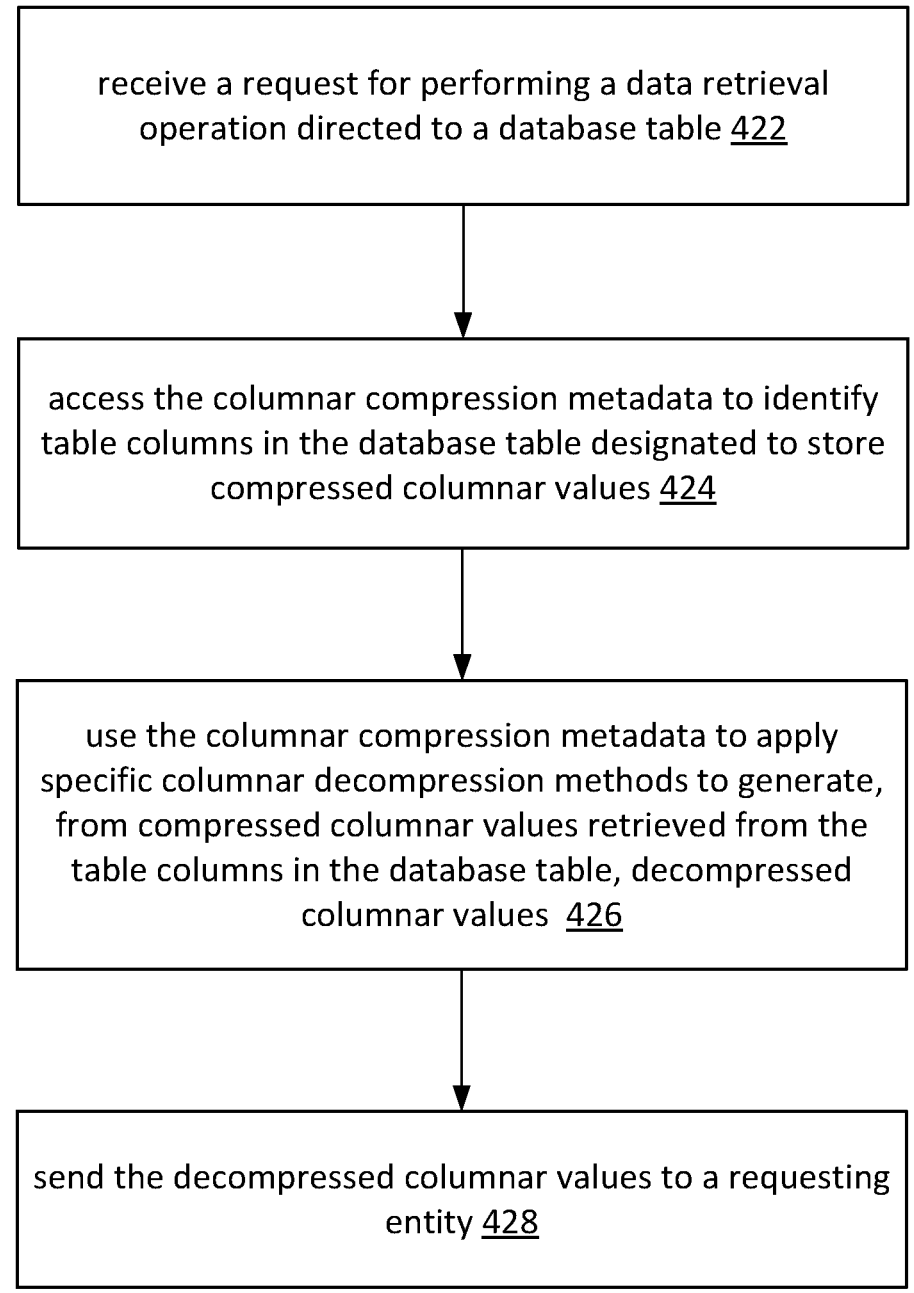

FIG. 4B illustrates an example process flow that may be implemented by one or more computing devices such as a columnar compression system comprising a database server, an application server, a combination of database and application servers, etc., as described herein. In block 422, the system receives a request for performing a data retrieval operation directed to a database table.

In block 424, the system accesses columnar compression metadata to identify one or more table columns in the database table designated to store compressed columnar values.

In block 426, the system uses the columnar compression metadata to apply one or more columnar decompression methods to generate, from one or more compressed columnar values retrieved from the one or more table columns in the database table, one or more decompressed columnar values.

In block 428, the system sending the one or more decompressed columnar values to a requesting entity initiating the request for the data retrieval operation.

In an embodiment, the one or more columnar decompression methods include a columnar decompression method that generates decompressed columnar values by a modified query that joins a metadata dictionary table using compressed columnar values retrieved from the database table.

In an embodiment, the system is further configured to perform: receiving a request for performing a data retrieval operation directed to the database table; retrieving one or more compressed columnar values from the one or more table columns in the database table; sending the one or more compressed columnar values to a requesting entity initiating the request for the data retrieval operation.

In an embodiment, the one or more columnar compression methods include one or more of: dictionary-based compression methods, run-length-encoding based compression methods, Lempel-Ziv-Welch (LZW) compression methods, other lossless data compression methods, etc.

In an embodiment, the database statement is passed by an application server to a database server for executing with respect to a database via a database connection object.

In an embodiment, the one or more uncompressed columnar values received with the request for the data storing operation are of a data type that is different from a second data type of the one or more compressed columnar values.

In an embodiment, the one or more compressed columnar values are ordered by one of: an ordered metadata dictionary or an index generated based on an indexed column.

In some embodiments, process flows involving operations, methods, etc., as described herein can be performed through one or more computing devices or units.

In an embodiment, an apparatus comprises a processor and is configured to perform any of these operations, methods, process flows, etc.

In an embodiment, a non-transitory computer readable storage medium, storing software instructions, which when executed by one or more processors cause performance of any of these operations, methods, process flows, etc.

In an embodiment, a computing device comprising one or more processors and one or more storage media storing a set of instructions which, when executed by the one or more processors, cause performance of any of these operations, methods, process flows, etc. Note that, although separate embodiments are discussed herein, any combination of embodiments and/or partial embodiments discussed herein may be combined to form further embodiments.

4.0 IMPLEMENTATION MECHANISMS—HARDWARE OVERVIEW

According to one embodiment, the techniques described herein are implemented by one or more special-purpose computing devices. The special-purpose computing devices may be hard-wired to perform the techniques, or may include digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, portable computer systems, handheld devices, networking devices or any other device that incorporates hard-wired and/or program logic to implement the techniques.

Figure 5:
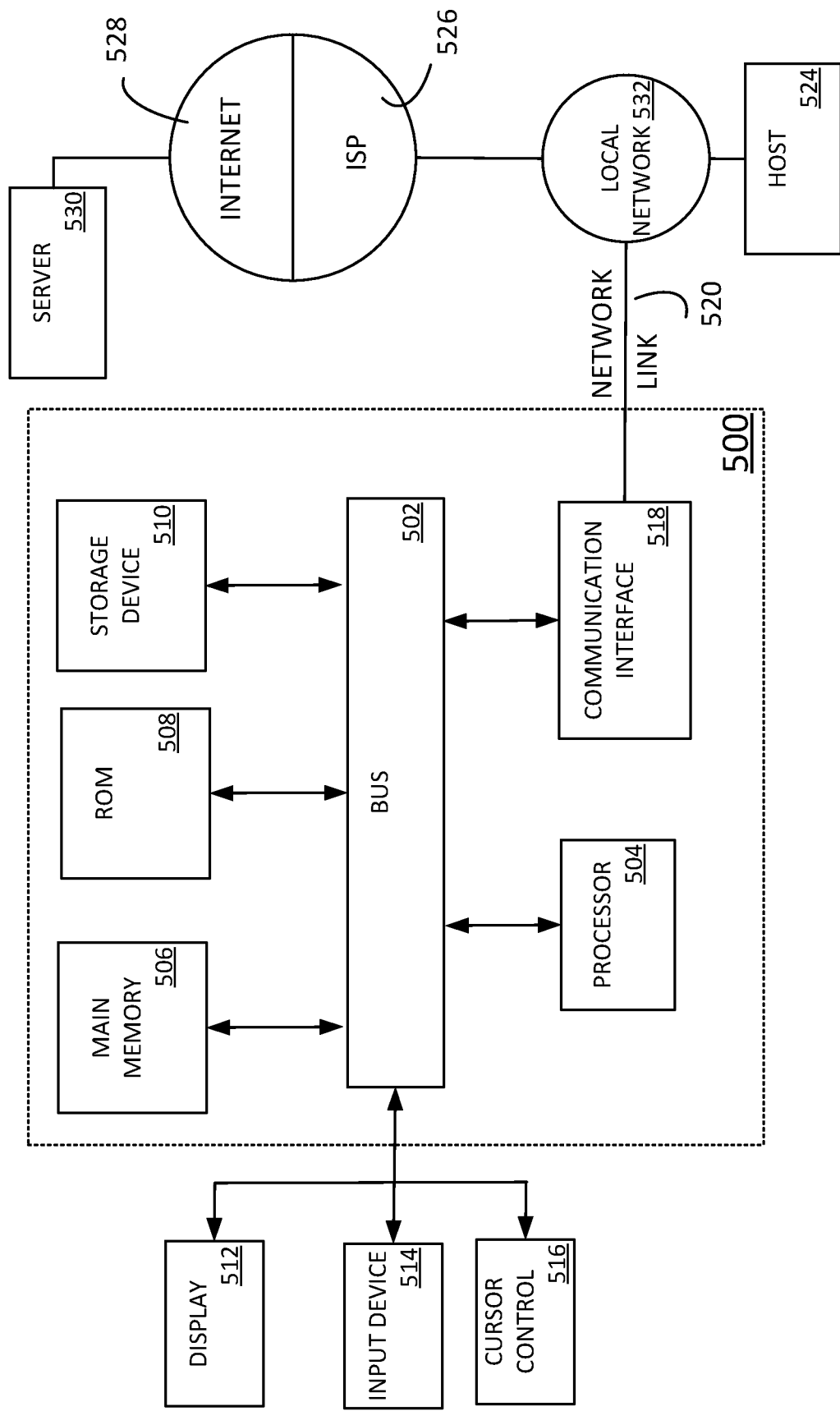
FIG. 5 illustrates an example hardware platform on which a computer or a computing device as described herein may be implemented.

For example, FIG. 5 is a block diagram that illustrates a computer system 500 upon which an embodiment of the invention may be implemented. Computer system 500 includes a bus 502 or other communication mechanism for communicating information, and a hardware processor 504 coupled with bus 502 for processing information. Hardware processor 504 may be, for example, a general purpose microprocessor.

Computer system 500 also includes a main memory 506, such as a random access memory (RAM) or other dynamic storage device, coupled to bus 502 for storing information and instructions to be executed by processor 504. Main memory 506 also may be used for storing temporary variables or other intermediate information during execution of instructions to be executed by processor 504. Such instructions, when stored in non-transitory storage media accessible to processor 504, render computer system 500 into a special-purpose machine that is device-specific to perform the operations specified in the instructions.

Computer system 500 further includes a read only memory (ROM) 508 or other static storage device coupled to bus 502 for storing static information and instructions for processor 504. A storage device 510, such as a magnetic disk or optical disk, is provided and coupled to bus 502 for storing information and instructions.

Computer system 500 may be coupled via bus 502 to a display 512, such as a liquid crystal display (LCD), for displaying information to a computer user. An input device 514, including alphanumeric and other keys, is coupled to bus 502 for communicating information and command selections to processor 504. Another type of user input device is cursor control 516, such as a mouse, a trackball, or cursor direction keys for communicating direction information and command selections to processor 504 and for controlling cursor movement on display 512. This input device typically has two degrees of freedom in two axes, a first axis (e.g., x) and a second axis (e.g., y), that allows the device to specify positions in a plane.

Computer system 500 may implement the techniques described herein using device-specific hard-wired logic, one or more ASICs or FPGAs, firmware and/or program logic which in combination with the computer system causes or programs computer system 500 to be a special-purpose machine. According to one embodiment, the techniques herein are performed by computer system 500 in response to processor 504 executing one or more sequences of one or more instructions contained in main memory 506. Such instructions may be read into main memory 506 from another storage medium, such as storage device 510. Execution of the sequences of instructions contained in main memory 506 causes processor 504 to perform the process steps described herein. In alternative embodiments, hard-wired circuitry may be used in place of or in combination with software instructions.

The term "storage media" as used herein refers to any non-transitory media that store data and/or instructions that cause a machine to operation in a specific fashion. Such storage media may comprise non-volatile media and/or volatile media. Non-volatile media includes, for example, optical or magnetic disks, such as storage device 510. Volatile media includes dynamic memory, such as main memory 506. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 502. Transmission media can also take the form of acoustic or light waves, such as those generated during radio-wave and infra-red data communications.

Various forms of media may be involved in carrying one or more sequences of one or more instructions to processor 504 for execution. For example, the instructions may initially be carried on a magnetic disk or solid state drive of a remote computer. The remote computer can load the instructions into its dynamic memory and send the instructions over a telephone line using a modem. A modem local to computer system 500 can receive the data on the telephone line and use an infra-red transmitter to convert the data to an infra-red signal. An infra-red detector can receive the data carried in the infra-red signal and appropriate circuitry can place the data on bus 502. Bus 502 carries the data to main memory 506, from which processor 504 retrieves and executes the instructions. The instructions received by main memory 506 may optionally be stored on storage device 510 either before or after execution by processor 504.

Computer system 500 also includes a communication interface 518 coupled to bus 502. Communication interface 518 provides a two-way data communication coupling to a network link 520 that is connected to a local network 522. For example, communication interface 518 may be an integrated services digital network (ISDN) card, cable modem, satellite modem, or a modem to provide a data communication connection to a corresponding type of telephone line. As another example, communication interface 518 may be a local area network (LAN) card to provide a data communication connection to a compatible LAN. Wireless links may also be implemented. In any such implementation, communication interface 518 sends and receives electrical, electromagnetic or optical signals that carry digital data streams representing various types of information.

Network link 520 typically provides data communication through one or more networks to other data devices. For example, network link 520 may provide a connection through local network 522 to a host computer 524 or to data equipment operated by an Internet Service Provider (ISP) 526. ISP 526 in turn provides data communication services through the world wide packet data communication network now commonly referred to as the "Internet" 528. Local network 522 and Internet 528 both use electrical, electromagnetic or optical signals that carry digital data streams. The signals through the various networks and the signals on network link 520 and through communication interface 518, which carry the digital data to and from computer system 500, are example forms of transmission media.

Computer system 500 can send messages and receive data, including program code, through the network(s), network link 520 and communication interface 518. In the Internet example, a server 530 might transmit a requested code for an application program through Internet 528, ISP 526, local network 522 and communication interface 518.

The received code may be executed by processor 504 as it is received, and/or stored in storage device 510, or other non-volatile storage for later execution.

5.0 EQUIVALENTS, EXTENSIONS, ALTERNATIVES AND MISCELLANEOUS

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A computer-implemented method, comprising:
receiving, by an application server operating in conjunction with a database server, a request for performing a data storing operation directed to a database table that comprises a plurality of table columns, wherein the request is generated by a user device;
in response to receiving the request, accessing, by the application server, columnar compression metadata to identify one or more table columns in the database table, each of the one or more table columns being designated to store compressed columnar values;
generating, by the application server from one or more uncompressed columnar values received with the request for the data storing operation, one or more compressed columnar values by applying one or more columnar compression methods specified in the columnar compression metadata, wherein a database statement is generated by the application server based on the request generated by the user device; wherein the database statement is specified with the one or more compressed columnar values generated from the one or more uncompressed columnar values received with the request generated by the user device; wherein the database statement is sent by the application server to the database server;
causing the database statement to be executed with the database server to persist the one or more compressed columnar values in the one or more table columns in the database table.

2. The method as recited in claim 1, further comprising:
receiving a request for performing a data retrieval operation directed to the database table;
accessing the columnar compression metadata to identify the one or more table columns in the database table designated to store compressed columnar values;
using the columnar compression metadata to apply one or more columnar decompression methods to generate, from one or more compressed columnar values retrieved from the one or more table columns in the database table, one or more decompressed columnar values;
sending the one or more decompressed columnar values to a requesting entity initiating the request for the data retrieval operation.

3. The method as recited in claim 2, wherein the one or more columnar decompression methods include a columnar decompression method that generates decompressed columnar values by a modified query that joins a metadata dictionary table using compressed columnar values retrieved from the database table.

4. The method as recited in claim 1, further comprising:
receiving a request for performing a data retrieval operation directed to the database table;
retrieving one or more compressed columnar values from the one or more table columns in the database table;
sending the one or more compressed columnar values to a requesting entity initiating the request for the data retrieval operation.

5. The method as recited in claim 1, wherein the one or more columnar compression methods include one or more of: dictionary-based compression methods, run-length-encoding based compression methods, Lempel—Ziv—Welch (LZW) compression methods, or other lossless data compression methods.

6. The method as recited in claim 1, wherein the database statement is passed by the application server to the database server for executing with respect to a database via a database connection object.

7. The method as recited in claim 1, wherein the one or more uncompressed columnar values received with the request for the data storing operation are of a data type that is different from a second data type of the one or more compressed columnar values.

8. The method as recited in claim 1, wherein the one or more compressed columnar values are ordered by one of: an ordered metadata dictionary or an index generated based on an indexed column.

9. One or more non-transitory computer readable media storing a program of instructions that is executable by a device to perform:
receiving, by an application server operating in conjunction with a database server, a request for performing a data storing operation directed to a database table that comprises a plurality of table columns, wherein the request is generated by a user device;
in response to receiving the request, accessing, by the application server, columnar compression metadata to identify one or more table columns in the database table, each of the one or more table columns being designated to store compressed columnar values;
generating, by the application server from one or more uncompressed columnar values received with the request for the data storing operation, one or more compressed columnar values by applying one or more columnar compression methods specified in the columnar compression metadata, wherein a database statement is generated by the application server based on the request generated by the user device; wherein the database statement is specified with the one or more compressed columnar values; wherein the database statement is sent by the application server to the database server;
causing the database statement to be executed with the database server to persist the one or more compressed columnar values in the one or more table columns in the database table.

10. The media as recited in claim 9, wherein the program of instructions is executable by a device to further perform:
receiving a request for performing a data retrieval operation directed to the database table;
accessing the columnar compression metadata to identify the one or more table columns in the database table designated to store compressed columnar values;
using the columnar compression metadata to apply one or more columnar decompression methods to generate, from one or more compressed columnar values retrieved from the one or more table columns in the database table, one or more decompressed columnar values;
sending the one or more decompressed columnar values to a requesting entity initiating the request for the data retrieval operation.

11. The media as recited in claim 10, wherein the one or more columnar decompression methods include a columnar decompression method that generates decompressed columnar values by a modified query that joins a metadata dictionary table using compressed columnar values retrieved from the database table.

12. The media as recited in claim 9, wherein the program of instructions is executable by a device to further perform:
receiving a request for performing a data retrieval operation directed to the database table;
retrieving one or more compressed columnar values from the one or more table columns in the database table;
sending the one or more compressed columnar values to a requesting entity initiating the request for the data retrieval operation.

13. The media as recited in claim 9, wherein the one or more columnar compression methods include one or more of: dictionary-based compression methods, run-length-encoding based compression methods, Lempel—Ziv—Welch (LZW) compression methods, or other lossless data compression methods.

14. The media as recited in claim 9, wherein the database statement is passed by the application server to the database server for executing with respect to a database via a database connection object.

15. The media as recited in claim 9, wherein the one or more uncompressed columnar values received with the request for the data storing operation are of a data type that is different from a second data type of the one or more compressed columnar values.

16. The media as recited in claim 9, wherein the one or more compressed columnar values are ordered by one of: an ordered metadata dictionary or an index generated based on an indexed column.

17. A system, comprising:
one or more computing processors;
one or more non-transitory computer readable media storing a program of instructions that is executable by the one or more computing processors to perform:
receiving, by an application server operating in conjunction with a database server, a request for performing a data storing operation directed to a database table that comprises a plurality of table columns, wherein the request is generated by a user device;
in response to receiving the request, accessing, by the application server, columnar compression metadata to identify one or more table columns in the database table, each of the one or more table columns being designated to store compressed columnar values;
generating, by the application server from one or more uncompressed columnar values received with the request for the data storing operation, one or more compressed columnar values by applying one or more columnar compression methods specified in the columnar compression metadata, wherein a database statement is generated by the application server based on the request generated by the user device; wherein the database statement is specified with the one or more compressed columnar values; wherein the database statement is sent by the application server to the database server;
causing the database statement to be executed with the database server to persist the one or more compressed columnar values in the one or more table columns in the database table.

18. The system as recited in claim 17, wherein the program of instructions is executable by the one or more computing processors to further perform:
receiving a request for performing a data retrieval operation directed to the database table;
accessing the columnar compression metadata to identify the one or more table columns in the database table designated to store compressed columnar values;
using the columnar compression metadata to apply one or more columnar decompression methods to generate, from one or more compressed columnar values retrieved from the one or more table columns in the database table, one or more decompressed columnar values;
sending the one or more decompressed columnar values to a requesting entity initiating the request for the data retrieval operation.

19. The system as recited in claim 18, wherein the one or more columnar decompression methods include a columnar decompression method that generates decompressed columnar values by a modified query that joins a metadata dictionary table using compressed columnar values retrieved from the database table.

20. The system as recited in claim 17, wherein the program of instructions is executable by the one or more computing processors to further perform:
receiving a request for performing a data retrieval operation directed to the database table;
retrieving one or more compressed columnar values from the one or more table columns in the database table;
sending the one or more compressed columnar values to a requesting entity initiating the request for the data retrieval operation.

21. The system as recited in claim 17, wherein the one or more columnar compression methods include one or more of: dictionary-based compression methods, run-length-encoding based compression methods, Lempel—Ziv—Welch (LZW) compression methods, or other lossless data compression methods.

22. The system as recited in claim 17, wherein the database statement is passed by the application server to the database server for executing with respect to a database via a database connection object.

23. The system as recited in claim 17, wherein the one or more uncompressed columnar values received with the request for the data storing operation are of a data type that is different from a second data type of the one or more compressed columnar values.

24. The system as recited in claim 17, wherein the one or more compressed columnar values are ordered by one of: an ordered metadata dictionary or an index generated based on an indexed column.

* * * * *